United States Patent
Kim et al.

(10) Patent No.: US 11,352,707 B2
(45) Date of Patent: Jun. 7, 2022

(54) COPPER FOIL WITH MINIMIZED BAGGINESS AND TEAR, ELECTRODE COMPRISING THE SAME, SECONDARY BATTERY COMPRISING THE SAME AND METHOD FOR MANUFACTURING THE SAME

(71) Applicant: KCF Technologies Co., Ltd., Anyang-si (KR)

(72) Inventors: Seung Min Kim, Anyang-si (KR); An Na Lee, Anyang-si (KR); Ho Gun Kim, Anyang-si (KR); Shan Hua Jin, Anyang-si (KR)

(73) Assignee: SK NEXILIS CO., LTD., Jeongeup-si (KR)

( * ) Notice: Subject to any disclaimer, the term of this patent is extended or adjusted under 35 U.S.C. 154(b) by 455 days.

(21) Appl. No.: 15/999,169

(22) Filed: Aug. 17, 2018

(65) Prior Publication Data
US 2019/0003066 A1     Jan. 3, 2019

(30) Foreign Application Priority Data

Jun. 20, 2017   (KR) .................. 10-2017-0077658

(51) Int. Cl.
C25D 1/04       (2006.01)
C25D 3/38       (2006.01)
(Continued)

(52) U.S. Cl.
CPC .............. C25D 1/04 (2013.01); C25D 3/38 (2013.01); C25D 3/58 (2013.01); C25D 5/605 (2020.08);
(Continued)

(58) Field of Classification Search
CPC ........ C23C 2222/20; C25D 1/04; C25D 3/38; C25D 3/58; C25D 5/12; C25D 5/16;
(Continued)

(56) References Cited

U.S. PATENT DOCUMENTS 6,051,340 A * 4/2000 Kawakami ............ H01M 4/134
                                                429/231.95
2007/0284258 A1  12/2007 Yoshimoto et al.
(Continued)

FOREIGN PATENT DOCUMENTS

CN      106191939 A    12/2016
EP       3067199 A1     9/2016
(Continued)

OTHER PUBLICATIONS

European Search Report for related European Application No. 18187922.2; action dated Jan. 18, 2019; (19 pages).
(Continued)

Primary Examiner — Adam A Arciero
(74) Attorney, Agent, or Firm — K&L Gates LLP

(57) ABSTRACT

Disclosed is a copper foil including a copper layer and an anticorrosive layer disposed on the copper layer, wherein the copper foil has a peak to arithmetic mean roughness (PAR) of 0.8 to 12.5, a tensile strength of 29 to 58 kgf/mm$^2$, and a weight deviation of 3% or less, wherein the PAR is calculated in accordance with the following Equation 1:

$PAR = Rp/Ra$     [Equation 1]

wherein Rp is a maximum profile peak height and Ra is an arithmetic mean roughness.

6 Claims, 5 Drawing Sheets

(51) Int. Cl.
*H05K 1/09* (2006.01)
*H01M 4/66* (2006.01)
*C25D 7/06* (2006.01)
*C25D 3/58* (2006.01)
*C25D 5/00* (2006.01)
*H05K 1/03* (2006.01)
*H05K 3/02* (2006.01)
*H01M 10/0525* (2010.01)

(52) U.S. Cl.
CPC ........... *C25D 5/617* (2020.08); *C25D 7/0614* (2013.01); *H01M 4/661* (2013.01); *H01M 4/667* (2013.01); *H05K 1/09* (2013.01); *C23C 2222/20* (2013.01); *H01M 10/0525* (2013.01); *H05K 1/0393* (2013.01); *H05K 3/022* (2013.01); *H05K 2201/0355* (2013.01); *H05K 2203/0726* (2013.01)

(58) Field of Classification Search
CPC ........................ C25D 7/0614; H01M 10/0525; H01M 4/661; H01M 4/667; H05K 1/0393; H05K 1/09; H05K 2201/0355; H05K 2203/0726; H05K 3/022
See application file for complete search history.

(56) References Cited

U.S. PATENT DOCUMENTS

| | | | |
|---|---|---|---|
| 2008/0176144 A1* | 7/2008 | Iwama | H01M 4/134 429/338 |
| 2013/0071755 A1* | 3/2013 | Oguro | C25D 5/34 429/245 |
| 2013/0256140 A1* | 10/2013 | Kohiki | H05K 1/09 205/50 |
| 2015/0030873 A1* | 1/2015 | Cheng | H01M 10/0525 428/606 |
| 2018/0288867 A1* | 10/2018 | Fukuchi | B32B 27/306 |

FOREIGN PATENT DOCUMENTS

| | | |
|---|---|---|
| EP | 3309881 A1 | 4/2018 |
| JP | 2004162144 A | 6/2004 |
| JP | 2010189753 A | 9/2010 |
| JP | 2012-022939 | 2/2012 |
| JP | 2012172195 A | 9/2012 |
| JP | 2018063938 A | 4/2018 |
| JP | 2018080384 A | 5/2018 |
| JP | 2018109226 A | 7/2018 |
| KR | 1020020081698 A | 10/2002 |
| KR | 1020090026128 A | 3/2009 |
| KR | 1020100125044 A | 11/2010 |
| KR | 20150011751 A | 2/2015 |
| KR | 20170000761 A | 1/2017 |
| KR | 20170028047 A | 3/2017 |
| KR | 1020170036262 | 4/2017 |
| KR | 1020180083515 A | 7/2018 |
| TW | 201700739 A | 1/2017 |
| TW | 201704487 A | 2/2017 |

OTHER PUBLICATIONS

Extended European Search Report for related European Application No. 18187922.2; action dated Mar. 26, 2019; (17 pages).

* cited by examiner

COPPER FOIL WITH MINIMIZED BAGGINESS AND TEAR, ELECTRODE COMPRISING THE SAME, SECONDARY BATTERY COMPRISING THE SAME AND METHOD FOR MANUFACTURING THE SAME

CROSS-REFERENCE TO RELATED APPLICATION

Pursuant to 35 U.S.C. § 119(a), this application claims the benefit of earlier filing date and right of priority to Korean Application No. 10-2017-0077658, filed on Jun. 20, 2017, in the Korean Intellectual Property Office, the disclosure of which is hereby incorporated by reference in its entirety.

BACKGROUND OF THE DISCLOSURE

Field of the Disclosure

The present disclosure relates to a copper foil with minimized bagginess and tear, an electrode including the same, a secondary battery including the same, and a method for manufacturing the same.

Description of the Related Art

Copper foils are used to manufacture a variety of products such as anodes for secondary batteries and flexible printed circuit boards (FPCBs).

Thereamong, a copper foil manufactured by electroplating is referred to as an "electrolytic copper foil". Such an electrolytic copper foil is generally manufactured by a roll to roll (RTR) process and is used to manufacture anodes for secondary batteries and flexible printed circuit boards (FPCBs) via an RTR process. The RTR process is known to be suitable for mass-production because it enables continuous production. However, when a copper foil is folded, torn or suffers bagginess during the RTR process, the operation of RTR equipment should be stopped until such problems are solved, and then the equipment should be operated again, thus causing deterioration in production efficiency.

When bagginess or tear occurs in a copper foil in the process of manufacturing secondary batteries using the copper foil, it is difficult to stably manufacture products. As such, bagginess or tear occurring in the copper foil in the process of manufacturing secondary batteries results in deterioration in manufacturing yields of secondary batteries and increased manufacture costs of products.

As a method for removing the causes derived from the copper foil, among the causes of bagginess and tear defects occurring in the process of manufacturing secondary batteries, there is a method of controlling the weight deviation of the copper foil to a low level. However, only control over the weight deviation of the copper foil has a limitation in completely solving problems of bagginess and tear occurring during the manufacture of secondary batteries. In particular, recently, in an attempt to increase the capacity of secondary batteries, an ultra-thin copper foil, for example, a copper foil with a thickness of 8 μm or less, is increasingly used as an anode current collector. In this case, although the weight deviation of the copper foil is accurately controlled, bagginess and tear defects intermittently occurs in the process of manufacturing secondary batteries. Accordingly, there is a need for preventing or suppressing bagginess or tear of copper foils in the process of manufacturing secondary batteries.

SUMMARY OF THE DISCLOSURE

Therefore, the present disclosure has been made in view of the above problems, and it is one object of the present disclosure to provide a copper foil, an electrode including the same, a secondary battery including the same, and a method for manufacturing the same.

It is another object of the present disclosure to provide a copper foil with minimized bagginess or tear. In particular, it is another object of the present disclosure to provide a copper foil that is capable of preventing occurrence of bagginess or tear in the process of manufacturing a secondary battery in spite of small thickness and thus provide excellent roll-to-roll (RTR) processability.

It is another object of the present disclosure to provide an electrode for secondary batteries including the copper foil and a secondary battery including the electrode for secondary batteries.

It is another object of the present disclosure to provide a flexible copper foil laminate film including the copper foil.

It is another object of the present disclosure to provide a method for manufacturing a copper foil that is capable of preventing occurrence of bagginess or tear in the manufacturing process.

Apart from the aspects of the present disclosure mentioned above, other features and advantages of the present disclosure will be described below and would be clearly understood from the description by those skilled in the art.

In accordance with the present disclosure, the above and other objects can be accomplished by the provision of a copper foil including a copper layer and an anticorrosive layer disposed on the copper layer, wherein the copper foil has a peak to arithmetic mean roughness (PAR) of 0.8 to 12.5, a tensile strength of 29 to 58 kgf/mm², and a weight deviation of 3% or less, wherein the PAR is calculated in accordance with the following Equation 1:

$$PAR = Rp/Ra \qquad \text{[Equation 1]}$$

wherein Rp is a maximum profile peak height and Ra is an arithmetic mean roughness.

The copper foil may have a (220) plane and the (220) plane may have a texture coefficient [TC(220)] of 0.49 to 1.28.

The anticorrosive layer may include at least one of chromium (Cr), a silane compound or a nitrogen compound.

The copper foil may have a thickness of 4 μm to 30 μm.

In accordance with another aspect of the present disclosure, there is provided an electrode for secondary batteries including the copper foil according to the present disclosure and an active material layer disposed on the copper foil.

In accordance with another aspect of the present disclosure, there is provided a secondary battery including a cathode, an anode facing the cathode, an electrolyte disposed between the cathode and the anode to provide an environment enabling ions to move, and a separator to electrically insulate (isolate) the cathode from the anode, wherein the anode includes the copper foil according to the present disclosure and an active material layer disposed on the copper foil.

In accordance with another aspect of the present disclosure, there is provided a flexible copper foil laminate film including a polymer membrane and the copper foil according to the present disclosure disposed on the polymer membrane.

In accordance with another aspect of the present disclosure, there is provided a method for manufacturing a copper foil including applying a current density of 40 to 80 A/dm² to an electrode plate and a rotary electrode drum spaced from each other in an electrolyte containing copper ions to form a copper layer, wherein the electrolyte includes 70 to 90 g/L of copper ions, 50 to 150 g/L of sulfuric acid, 2 to 20 mg/L of 1-phenyl-5-mercapto-1H-tetrazole, and 2 to 20 mg/L of polyethylene glycol (PEG).

The electrolyte may include 50 mg/L or less of silver (Ag).

The method may include polishing a surface of the rotary electrode drum with a brush having a grit of #800 to #3000, before forming the copper layer.

The electrolyte may have a flow rate of 39 to 46 $m^3$/hour.

A deviation of flow rate per unit time (second) may be 5% or less.

The general description of the present disclosure given above is provided only for illustration or description and should not be construed as limiting the scope of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
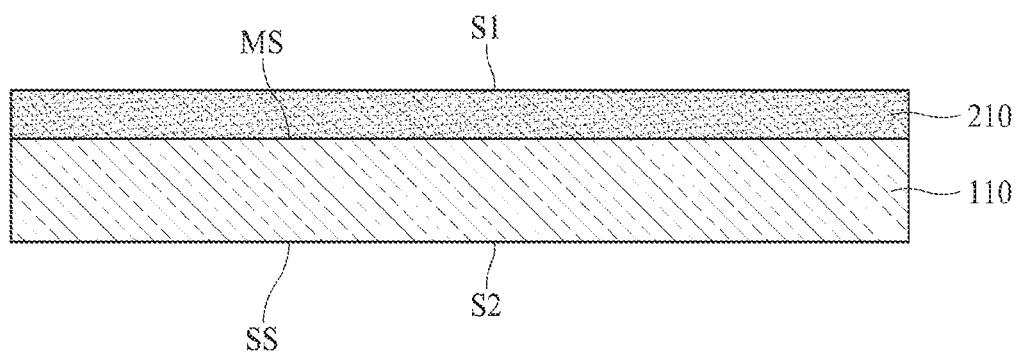
FIG. 1 is a schematic sectional view illustrating a copper foil according to an embodiment of the present disclosure.

Reference will now be made in detail to the preferred embodiments of the present disclosure, examples of which are illustrated in the accompanying drawings.

Those skilled in the art will appreciate that various modifications, additions and substitutions are possible, without departing from the scope and spirit of the disclosure as disclosed in the accompanying claims. Accordingly, the present disclosure encompasses the disclosure defined in claims and modifications and alterations that fall within the scope of the equivalents thereto.

The shapes, sizes, ratios, angles and numbers disclosed in the drawings for describing embodiments of the present disclosure are merely examples, and thus the present disclosure is not limited to the illustrated details. Like reference numerals refer to like elements throughout the specification.

In the case in which "comprise," "have," and "include" described in the present specification are used, another part may also be present unless "only" is used. The terms in a singular form may include plural forms unless noted to the contrary. In construing an element, the element is construed as including an error region although there is no explicit description thereof.

In describing a positional relationship, for example, when the positional order is described as "on," "above," "below," and "next," the case of no contact therebetween may be included, unless "just" or "direct" is used.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

FIG. 1 is a schematic sectional view illustrating a copper foil 100 according to an embodiment of the present disclosure.

Referring to FIG. 1, the copper foil 100 includes a copper layer 110 and an anticorrosive layer 210 disposed on the copper layer 110.

According to the embodiment of the present disclosure, the copper layer 110 has a matte surface MS and a shiny surface SS opposite to the matte surface SS.

Figure 8:
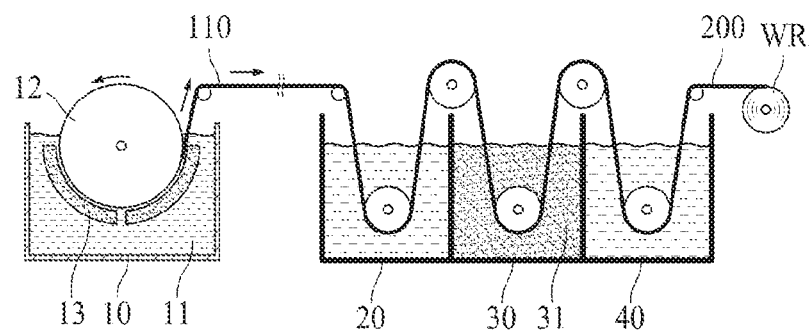
FIG. 8 is a schematic view illustrating a method for manufacturing the copper foil shown in FIG. 3.

The copper layer 110 may be, for example, formed on a rotary electrode drum by electroplating (see FIG. 8). At this time, the shiny surface SS refers to a surface of the copper layer 110 which contacts the rotary electrode drum during electroplating and the matte surface MS refers to a surface which is disposed opposite to the shiny surface SS.

The shiny surface SS generally has a lower surface roughness Rz than that of the matte surface MS, but the embodiment of the present disclosure is not limited thereto. The surface roughness Rz of the shiny surface SS may be equal to or higher than the surface roughness Rz of the matte surface MS.

The anticorrosive layer 210 may be disposed on at least one of the matte surface MS or the shiny surface SS of the copper layer 110. Referring to FIG. 1, the anticorrosive layer 210 is disposed on the matte surface MS, but the embodiments of the present disclosure are not limited thereto. That is, the anticorrosive layer 210 may be disposed only on the shiny surface SS, or both on the matte surface MS and the shiny surface SS.

The anticorrosive layer 210 protects the copper layer 110. The anticorrosive layer 210 can prevent the copper layer 110 from being oxidized or denatured upon storage. Accordingly, the anticorrosive layer 210 is also called a "protective layer". There is no particular limitation as to the anticorrosive layer 210 and any film or layer may be used as the anticorrosive layer 210 so long as it is capable of protecting the copper layer 110.

According to an embodiment of the present disclosure, the anticorrosive layer 210 may include at least one of chromium (Cr), a silane compound or a nitrogen compound.

For example, the anticorrosive layer 210 may be prepared from a chromium (Cr)-containing anticorrosive liquid, that is, a chromate compound-containing anticorrosive liquid.

According to an embodiment of the present disclosure, the copper foil 100 has a first surface S1 which is a surface of the direction of the matte surface MS based on the copper layer 110 and a second surface S2 which is a surface of the direction of the shiny surface SS. In FIG. 1, the first surface S1 of the copper foil 100 is a surface of the anticorrosive layer 210 and the second surface S2 thereof is a shiny surface SS.

According to an embodiment of the present disclosure, the copper foil 100 has a peak-to-arithmetic mean roughness (PAR) of 0.8 to 12.5.

Here, the PAR can be calculated by the following Equation 1:

$$PAR = Rp/Ra \quad \text{[Equation 1]}$$

wherein Rp is a maximum profile peak height and Ra is an arithmetic mean roughness.

Rp and Ra can be measured by a roughness tester in accordance with JIS B 0601-2001. Specifically, according to an embodiment of the present disclosure, Rp and Ra can be measured with an SJ-310 model commercially available from Mitutoyo Corporation. Upon measurement of Rp and Ra with an SJ-310 model from Mitutoyo Corporation, a measurement length excluding a cut off length is set to 4 mm and the cut off length is set to 0.8 mm at the beginning and late stages. In addition, the radius of a stylus tip is set to 2 µm and a measurement pressure is set to 0.75 mN. After the aforementioned setting, Rp and Ra can be obtained by measurement, which are based on values measured with the Mitutoyo roughness tester. Rp and Ra are repeatedly measured three times for evaluation of physical properties and an arithmetic mean value thereof is used.

In the case where the PAR of the copper foil 100 is higher than 12.5, when the copper foil 100 is wound on a roll, winder or bobbin in the process of producing the copper foil 100, air is trapped between copper foil and the copper foil, resulting in bagginess.

On the other hand, in the case where the PAR of the copper foil 100 is lower than 0.8, when the copper foil 100 is wound during the production of the copper foil 100 by a roll-to-roll process, weight overlap between the copper foils readily occurs. For this reason, as the winding length increases, the copper foil 100 is locally lengthened, which may cause a bagginess defect.

Figure 9:
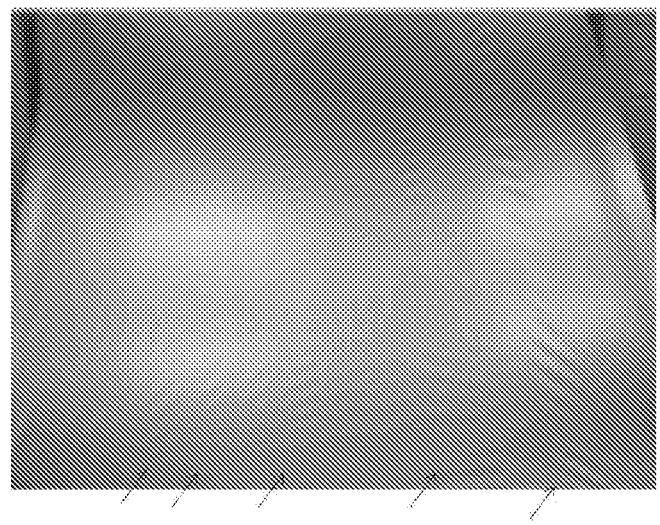
FIG. 9 is an image illustrating occurrence of bagginess in a copper foil.

FIG. 9 is an image illustrating occurrence of bagginess in a copper foil. The part represented by an arrow (↗) in FIG. 9 means the area where bagginess occurs. According to the embodiment of the present disclosure, bagginess refers to a state or a part in which the copper foil 100 does not spread evenly and flatly. In some cases, bagginess may also be called "wrinkle".

According to an embodiment of the present disclosure, the copper foil 100 has a tensile strength of 29 to 58 kgf/mm². The tensile strength may be measured with a universal testing machine (UTM) in accordance with the regulations of the IPC-TM-650 test method manual. According to an embodiment of the present disclosure, tensile strength may be measured with a universal testing machine available from Instron corporation. At this time, the width of a sample for measuring tensile strength is 12.7 mm, the distance between grips is 50 mm and measurement speed is 50 mm/min.

For evaluation of physical properties, the tensile strength of the sample is repeatedly measured three times and the mean thereof is used as a tensile strength of the copper foil 100.

When the tensile strength of copper foil 100 is less than 29 kgf/mm², during winding of the copper foil 100, bagginess defects may be generated by plastic deformation. On the other hand, when the tensile strength of the copper foil 100 is higher than 58 kgf/mm², the generation of bagginess or wrinkle may decrease, but the brittleness of the copper foil 100 is increased and the availableness of the copper foil 100 is deteriorated. For example, in the process of producing the copper foil or in the process of producing an electrode for secondary batteries using the copper foil, a tear may occur, which may make it difficult to stably obtain products.

Figure 10:
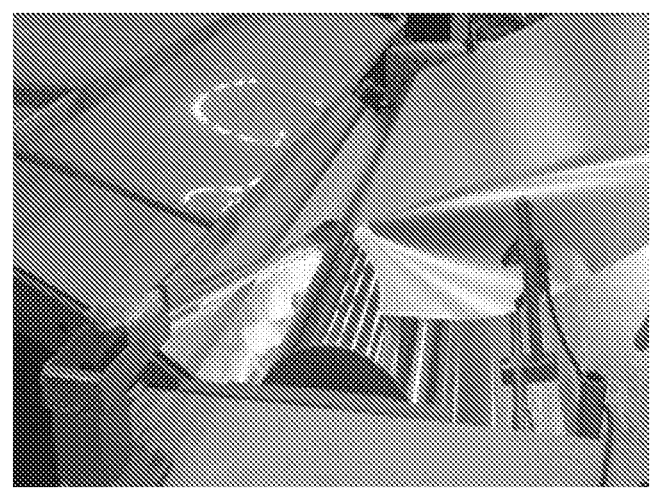
FIG. 10 is an image showing a torn copper foil.

FIG. 10 is an image showing a torn copper foil. For example, when such tear occurs in the process of manufacturing a copper foil by a roll-to-roll process, the operation of roll-to-roll process equipment should be ceased, the torn copper foil part should be removed and then the process equipment should be operated again. In this case, process time and costs are increased and production efficiency is deteriorated.

According to an embodiment of the present disclosure, the copper foil 100 has a weight deviation of 3% or less. More specifically, the copper foil 100 may have a weight deviation of 0 to 3%. In this case, zero weight deviation means that there is no weight deviation.

According to an embodiment of the present disclosure, the weight deviation can be obtained by a mean of weight values measured at three arbitrary points in a width direction of the copper foil 100 (mean weight) and a standard deviation of the weight values. Specifically, 5 cm×5 cm samples are each obtained at three points arranged along the width direction of the copper foil 100, that is, a direction vertical to the winding direction (transverse direction, TD), the weights of respective samples are measured, the weights per unit area are calculated, "mean weight" and "standard deviation of weight" at the three points are calculated from the weights per unit area of the three samples, and weight deviation is calculated in accordance with the following Equation 2:

$$\text{Weight deviation} = \frac{\text{Standard deviation of weight}}{\text{Mean weight}} \times 100 \quad \text{[Equation 2]}$$

In the case where the weight deviation of the copper foil 100 is higher than 3%, when the copper foil 100 is wound during the roll-to-roll process, it may be partially lengthened due to overlapping of tension or weight applied to the copper foil 100, causing bagginess of the copper foil 100. Accordingly, according to an embodiment of the present disclosure, the weight deviation of the copper foil 100 is controlled to 3% or less.

According to an embodiment of the present disclosure, the copper foil 100 has a (220) plane and a texture coefficient [TC(220)] of the (220) plane is 0.49 to 1.28. The texture coefficient [TC(220)] relates to the crystal structure of the surface of the copper foil 100.

Hereinafter, referring to FIG. 2, a method for measuring and calculating the texture coefficient of (220) plane [TC(220)] of the copper foil 100 according to the embodiment of the present disclosure will be described below.

Figure 2:
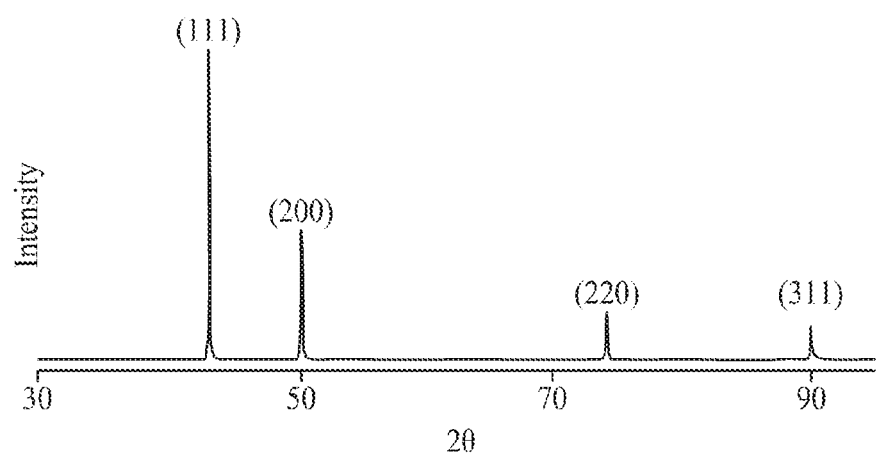
FIG. 2 shows an example of an XRD graph of the copper foil.

FIG. 2 shows an example of an XRD graph of a copper foil. More specifically, FIG. 2 is an XRD graph of a copper layer 110 constituting the copper foil 100.

For measurement of the texture coefficient of (220) plane [TC(220)], first, an XRD graph having peaks corresponding to n crystal planes is obtained by X-ray diffraction (XRD) in the diffraction angle (2θ) range of 30° to 95° [Target: Copper K alpha 1, 2θ interval: 0.01°, 2θ scan speed: 3°/min]. For example, as illustrated in FIG. 2, an XRD graph having peaks corresponding to (111), (200), (220) and (311) planes is obtained. Referring to FIG. 2, n is 4.

Then, from this graph, XRD diffraction intensity [I(hkl)] of each crystal plane (hkl) is obtained. In addition, XRD diffraction intensities [$I_0$(hkl)] of n respective crystal planes of a standard copper powder regulated by joint committee on powder diffraction standards (JCPDS) are obtained. Subsequently, the arithmetic mean value of "I(hkl)/$I_0$(hkl)" of n crystal planes is calculated and I(220)/$I_0$(220) of the (220) plane is divided by the arithmetic mean value to obtain the texture coefficient of (220) plane [TC(220)]. That is, the texture coefficient of (220) plane [TC(220)] is calculated based on the following Equation 3:

$$TC(220) = \frac{\frac{I(220)}{I_0(220)}}{\frac{1}{n}\sum \frac{I(hkl)}{I_0(hkl)}} \quad \text{[Equation 3]}$$

According to an embodiment of the present disclosure, the (220) plane of first and second surfaces S1 and S2 of the copper foil 100 may have a texture coefficient [TC(220)] of 0.49 to 1.28. More specifically, the (220) plane of the copper layer 110 may have a texture coefficient [TC(220)] of 0.49 to 1.28. As the texture coefficient of (220) plane [TC(220)] increases, the crystal structure of the copper foil 100 becomes denser.

When the texture coefficient of (220) plane [TC(220)] is lower than 0.49, the crystal structure of the copper foil 100 is not dense, the configuration (texture) of the copper foil 100 is readily deformed when wound on a roll, winder or bobbin, and the possibility of bagginess in the copper foil 100 increases. When the texture coefficient of the (220) plane is higher than 1.28, the texture of the copper foil 100 is excessively dense and becomes more brittle. Eventually, the copper foil 100 is torn in the process of manufacturing the copper foil 100 or a product using the copper foil 100, which may make it difficult to stably obtain products.

According to an embodiment of the present disclosure, the copper foil 100 may have a thickness of 4 μm to 30 μm. When the thickness of the copper foil 100 is less than 4 μm, workability is deteriorated in the process of manufacturing the copper foil 100 or a product, for example, an electrode for secondary batteries or a secondary battery using the copper foil 100. When the thickness of the copper foil 100 is higher than 30 μm, the thickness of the electrode for secondary batteries using the copper foil 100 is increased and there is a difficulty in realizing high capacity secondary batteries due to the thickness.

Figure 3:
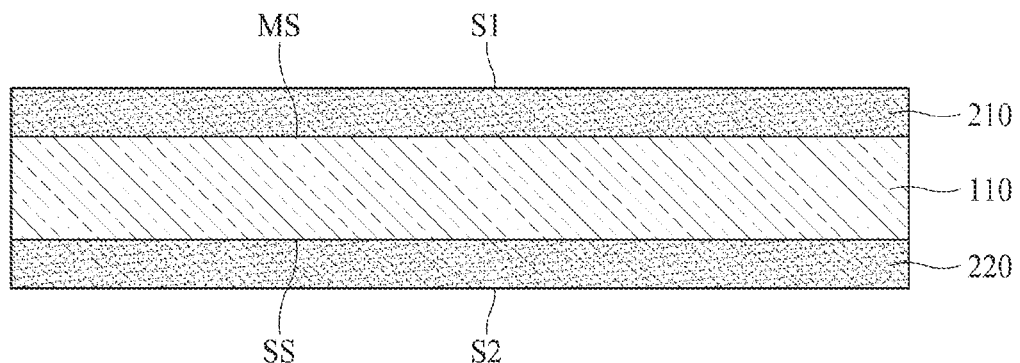
FIG. 3 is a schematic sectional view illustrating a copper foil according to another embodiment of the present disclosure.

FIG. 3 is a schematic sectional view illustrating a copper foil 200 according to another embodiment of the present disclosure. Hereinafter, description of constituent components given above will be omitted to avoid repetition.

Referring to FIG. 3, the copper foil 200 according to another embodiment of the present disclosure includes a copper layer 110, and two anticorrosive layers 210 and 220 each disposed on the matte surface MS and the shiny surface SS of the copper layer 110. Compared with the copper foil 100 shown in FIG. 1, the copper foil 200 shown in FIG. 3 further includes an anticorrosive layer 220 disposed on the shiny surface SS of the copper layer 110.

For convenience of description, the anticorrosive layer 210 disposed on the matte surface MS of the copper layer 110, among two anticorrosive layers 210 and 220, is referred to as a "first protective layer" and the anticorrosive layer 220 disposed on the shiny surface SS is referred to as a "second protective layer".

In addition, the first surface S1 of the copper foil 200 shown in FIG. 3 is the same as the surface of the anticorrosive layer 210 disposed on the matte surface MS, and the second surface S2 is the same as the surface of the anticorrosive layer 220 disposed on the shiny surface SS.

According to another embodiment of the present disclosure, each of two anticorrosive layers 210 and 220 may include at least one of chromium (Cr), a silane compound or a nitrogen compound.

The copper foil 200 shown in FIG. 3 has a peak to arithmetic mean roughness (PAR) of 0.8 to 12.5, a tensile strength of 29 to 58 kgf/mm$^2$ and a weight deviation of 3% or less.

In addition, the (220) plane of the copper foil 200 has a texture coefficient [TC(220)] of 0.49 to 1.28. More specifically, the (220) plane of the copper layer 110 constituting the copper foil 200 has a texture coefficient [TC(220)] of 0.49 to 1.28.

The copper foil 200 shown in FIG. 3 has a thickness of 4 μm to 30 μm.

Figure 4:
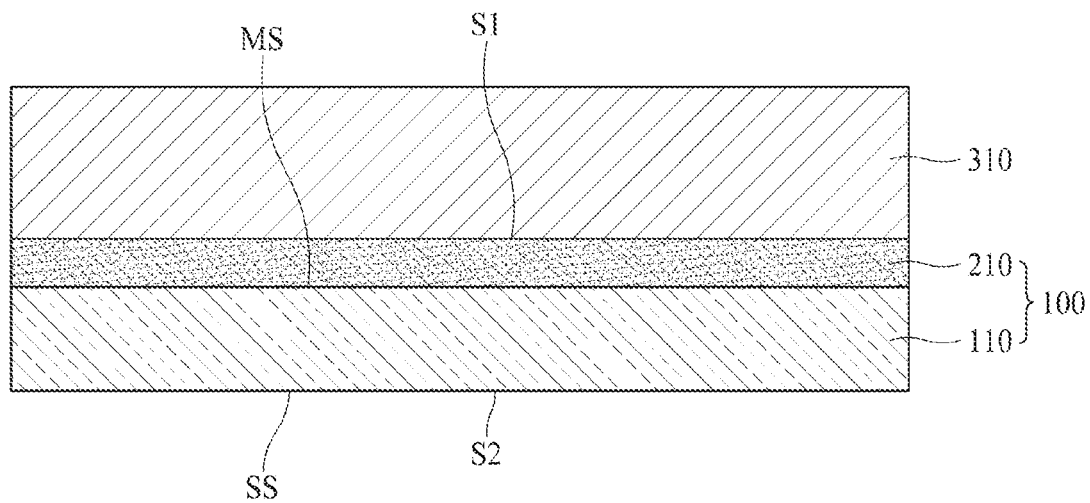
FIG. 4 is a schematic sectional view illustrating an electrode for secondary batteries according to another embodiment of the present disclosure.

FIG. 4 is a schematic sectional view illustrating an electrode 300 for secondary batteries according to another embodiment of the present disclosure.

Figure 6:
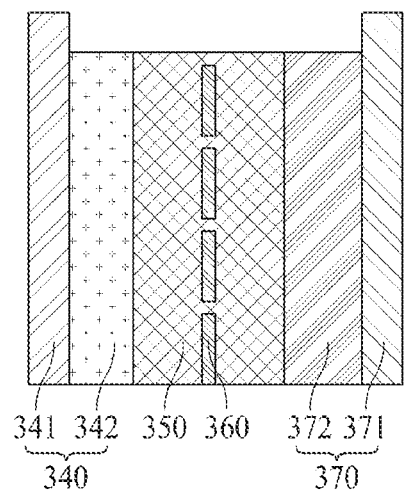
FIG. 6 is a schematic sectional view illustrating a secondary battery according to another embodiment of the present disclosure.

The electrode 300 for secondary batteries shown in FIG. 4 may be, for example, applied to the secondary battery 500 shown in FIG. 6.

Referring to FIG. 4, the electrode 300 for secondary batteries according to another embodiment of the present disclosure includes a copper foil 100 and an active material layer 310 disposed on the copper foil 100. In this case, the copper foil 100 is used as a current collector.

More specifically, the electrode 300 for secondary batteries according to another embodiment of the present disclosure includes a copper foil 100 having a first surface S1 and a second surface S2, and an active material layer 310 disposed on at least one of the first surface S1 or the second surface S2 of the copper foil 100. In addition, the copper foil 100 includes a copper layer 110 and an anticorrosive layer 210 dispose on the copper layer 110.

FIG. 4 shows that the copper foil 100 shown in FIG. 1 is used as a current collector. However, the one embodiment of the present disclosure is not limited thereto and the copper foil 200 shown in FIG. 3 may be used as a current collector of the electrode 300 for secondary batteries.

In addition, the configuration in which the active material layer 310 is disposed only on the first surface S1 among the surfaces S1 and S2 of the copper foil 100 is illustrated in FIG. 4, but other embodiments of the present disclosure are not limited thereto. The active material layer 310 may be disposed on both the first surface S1 and the second surface S2 of the copper foil 100, or on only the second surface S2 of the copper foil 100.

The active material layer 310 shown in FIG. 4 includes an electrode active material, in particular, an anode active material. That is, the electrode 300 for secondary batteries shown in FIG. 4 may be used as an anode.

The active material layer 310 may include at least one of carbon, a metal, a metal oxide, or a composite of a metal and carbon. The metal may include at least one of Ge, Sn, Li, Zn, Mg, Cd, Ce, Ni or Fe. In addition, in order to increase charge/discharge capacity of secondary batteries, the active material layer 310 may include silicon (Si).

When the copper foil 100 according to an embodiment of the present disclosure is used, tear or bagginess of the copper foil 100 is prevented in the process of manufacturing the electrode 300 for secondary batteries. Accordingly, the manufacturing efficiency of the electrode 300 for secondary batteries can be improved, and charge/discharge efficiency and capacity maintenance of a secondary battery including the electrode 300 for secondary batteries can be enhanced.

Figure 5:
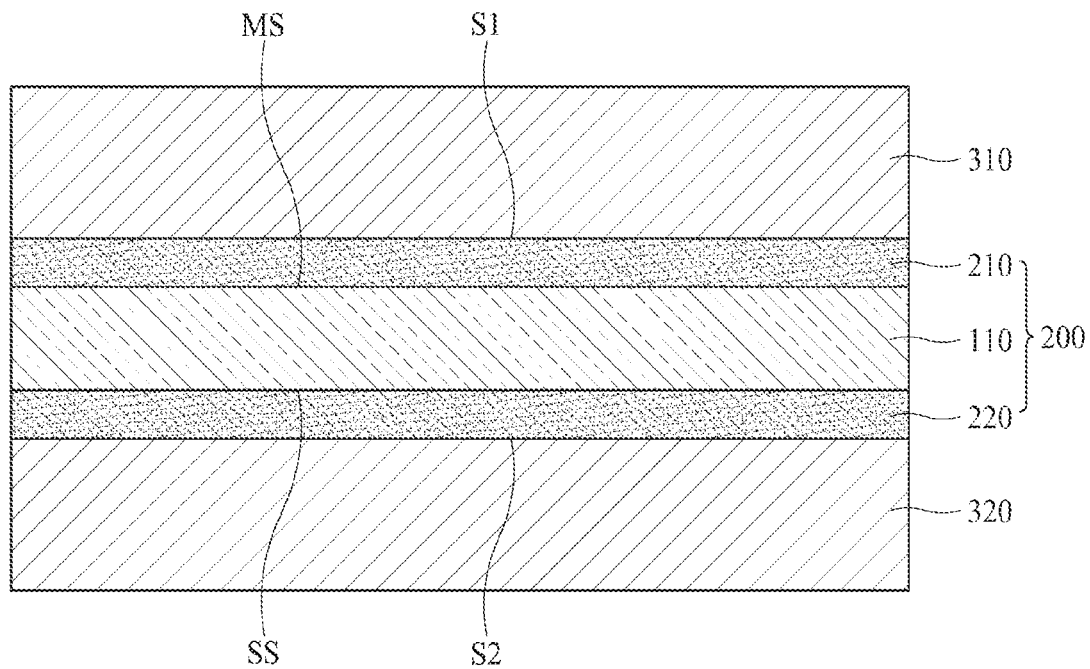
FIG. 5 is a schematic sectional view illustrating an electrode for secondary batteries according to another embodiment of the present disclosure.

FIG. 5 is a schematic sectional view illustrating an electrode 400 for secondary batteries according to another embodiment of the present disclosure.

The electrode 400 for secondary batteries according to another embodiment of the present disclosure includes a copper foil 200, and active material layers 310 and 320 disposed on the copper foil 200.

Referring to FIG. 5, the copper foil 200 includes a copper layer 110, and two anticorrosive layers 210 and 220 disposed on opposite surfaces MS and SS of the copper layer 110. In addition, the electrode 300 for secondary batteries shown in FIG. 5 includes two active material layers 310 and 320 disposed on both surfaces of the copper foil 200. Here, the active material layer 310 disposed on the first surface S1 of the copper foil 200 is referred to as a "first active material layer" and the active material layer 320 disposed on the second surface S2 of the copper foil 200 is referred to a "second active material layer".

The two active material layers 310 and 320 can be produced in the same manner and using the same material, or in a different manner and using a different material.

FIG. 6 is a schematic sectional view illustrating a secondary battery 500 according to another embodiment of the present disclosure. The secondary battery 500 shown in FIG. 6 is, for example, a lithium secondary battery.

Referring to FIG. 6, the secondary battery 500 includes a cathode 370, an anode 340 facing the cathode 370, an electrolyte 350 disposed between the cathode 370 and the anode 340 to provide an environment enabling ions to move, and a separator 360 to electrically insulate (isolate) the cathode 370 from the anode 340. Here, the ions that pass through the cathode 370 and the anode 340 are lithium ions. The separator 360 separates the cathode 370 from the anode 340 to prevent current charges generated at one electrode via the secondary battery 500 from moving to another electrode and then being unnecessarily consumed. Referring to FIG. 6, the separator 360 is disposed in the electrolyte 350.

The cathode 370 includes a cathode current collector 371 and a cathode active material layer 372. The cathode current collector 371 is, for example, an aluminium foil.

The anode 340 includes an anode current collector 341 and an active material layer 342. The active material layer 342 of the anode 340 includes an anode active material.

The copper foils 100 and 200 shown in FIGS. 1 and 3 may be used as the anode current collector 341. In addition, the electrodes 300 and 400 for secondary batteries shown in FIGS. 4 and 5, respectively, may be used as the anode 340 of the secondary battery 500 shown in FIG. 6.

Figure 7:
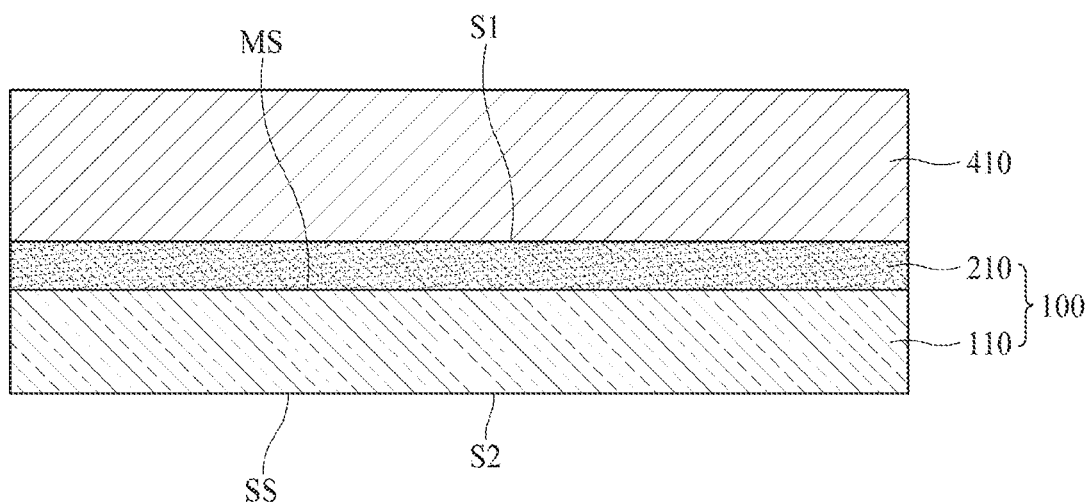
FIG. 7 is a sectional view illustrating a flexible copper foil laminate film according to another embodiment of the present disclosure.

FIG. 7 is a schematic sectional view illustrating a flexible copper foil laminate film 600 according to another embodiment of the present disclosure.

The flexible copper foil laminate film 600 according to another embodiment of the present disclosure includes a polymer membrane 410 and a copper foil 100 disposed on the polymer membrane 410. The flexible copper foil laminate film 600 including the copper foil 100 shown in FIG. 1 is illustrated in FIG. 7, but other embodiments of the present disclosure are not limited thereto. For example, the copper foil 200 shown in FIG. 3 or other copper foil may be used for the flexible copper foil laminate film 600.

The polymer membrane 410 is flexible and non-conductive. There is no particular limitation as to the kind of the polymer membrane 410. The polymer membrane 410, for example, includes polyimide. The flexible copper foil laminate film 600 can be produced by laminating a polyimide film and the copper foil 100 by a roll press. Alternatively, the flexible copper foil laminate film 600 can be produced by coating the copper foil 100 with a polyimide precursor solution and then heat-treating the resulting copper foil 100 as well.

The copper foil 100 includes a copper layer 110 having a matte surface MS and a shiny surface SS, and an anticorrosive layer 210 disposed on at least one of the matte surface MS and the shiny surface SS of the copper layer 110. In this case, the anticorrosive layer 210 may be omitted.

Referring to FIG. 7, the polymer membrane 410 is disposed on the anticorrosive layer 210, but the other embodiment of the present disclosure is not limited thereto. The polymer membrane 410 may be disposed on the shiny surface SS of the copper layer 110.

Hereinafter, a method for manufacturing a copper foil 200 according to another embodiment of the present disclosure will be described in detail with reference to FIG. 8.

FIG. 8 is a schematic view illustrating a method for manufacturing a copper foil 200 shown in FIG. 3.

First, a current density of 40 to 80 ASD (A/dm$^2$) is applied to an electrode plate 13 and a rotary electrode drum 12 spaced from each other in an electrolyte 11 containing copper ions to form a copper layer 110.

Specifically, referring to FIG. 8, the copper layer 110 is formed by electro-depositing copper on the electrode drum 12 when applying the current density of 40 to 80 ASD (A/dm$^2$) to the electrode plate 13 and the rotary electrode drum 12 disposed in the electrolyte 11 contained in the electrolytic bath 10. At this time, the gap between the electrode plate 13 and the rotary electrode drum 12 can be adjusted to the range of 8 to 13 mm.

As the current density applied to the electrode plate 13 and the rotary electrode drum 12 increases, plating becomes homogeneous and the surface roughness of the matte surface MS of the copper layer 110 is thus decreased. As the current density decreases, plating becomes heterogeneous and the surface roughness of the matte surface MS of the copper layer 110 is thus increased.

The electrolyte 11 contains 70 to 90 g/L of copper ions and 50 to 150 g/L of sulfuric acid. In the electrolyte 11 having the aforementioned concentrations, copper can be easily deposited on the rotary electrode drum 12.

In addition, the electrolyte 11 includes 2 to 20 mg/L of 1-phenyl-5-mercapto-1H-tetrazole and 2 to 20 mg/L of polyethylene glycol (PEG).

phenyl-5-mercapto-1H-tetrazole is abbreviated as "PMT" and may be represented by the following Formula 1.

[Formula 1]

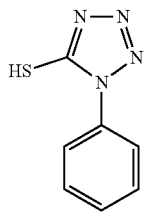

The tensile strength of the copper foil 200 can be controlled by controlling the concentration of 1-phenyl-5-mercapto-1H-tetrazole (PMT). In order for the tensile strength of the copper foil 200 to be adjusted to the range of 29 to 58 kgf/mm², the concentration of 1-phenyl-5-mercapto-1H-tetrazole is controlled to the range of 2 to 20 mg/L. When the concentration of 1-phenyl-5-mercapto-1H-tetrazole is less than 2 mg/L, the tensile strength of the copper foil 200 can be decreased to a level less than 29 kgf/mm². On the other hand, when the concentration of 1-phenyl-5-mercapto-1H-tetrazole is higher than 20 mg/L, the tensile strength of the copper foil 200 is higher than 58 kgf/mm².

Polyethylene glycol (PEG) acts as a brightener in the electrolyte 11.

When the concentration of polyethylene glycol (PEG) is excessively high, i.e., more than 20 mg/L, the texture of the (220) plane of the copper foil 200 is grown and the texture coefficient of (220) plane [TC(220)] exceeds 1.28. On the other hand, when the concentration of the polyethylene glycol (PEG) is less than 2 mg/L, the texture coefficient of (220) plane [TC(220)] of the copper foil 200 is less than 0.49. Accordingly, in order for the texture coefficient of (220) plane [TC(220)] of the copper foil 200 to be within the range of 0.49 to 1.28, the concentration of polyethylene glycol (PEG) is controlled to the range of 2 to 20 mg/L.

The electrolyte 11 includes 50 mg/L or less of silver (Ag). Here, silver (Ag) includes ions (Ag⁺) dissociated in the electrolyte 11 and a non-dissociated form (Ag), and includes silver (Ag) present in the form of a salt.

According to another embodiment of the present disclosure, as the concentration of silver (Ag) decreases, the peak to arithmetical mean roughness (PAR) of the copper foil 200 increases.

In general, silver (Ag) in the electrolyte 11 corresponds to impurities. To produce a copper foil 200 having a peak to arithmetic mean roughness (PAR) of 0.8 to 12.5, the concentration of silver (Ag) is controlled to 50 mg/L or less.

For example, when the concentration of silver (Ag) in the electrolyte 11 exceeds 50 mg/L, copper is heterogeneously electrodeposited on the rotary electrode drum 12, causing a rapid increase in maximum profile peak (Rp) of the copper foil 200 and thus making PAR higher than 12.5.

In order for the concentration of silver (Ag) in the electrolyte 11 to be controlled to 50 mg/L or less, a raw material not including silver (Ag) is used, or incorporation of silver (Ag) into the electrolyte 11 is prevented during the plating process. In addition, in order for the concentration of silver (Ag) in the electrolyte 11 to be maintained at 50 mg/L or less, the silver (Ag) can be removed by adding chlorine (Cl) to the electrolyte 11 to induce precipitation of silver (Ag) in the form of silver chloride (AgCl).

Meanwhile, the peak to arithmetic mean roughness (PAR) of the copper foil 200 can be changed depending on the polishing degree of the surface of the rotary electrode drum 12.

In order to control the peak to arithmetic mean roughness (PAR) of the copper foil 200, for example, the surface of the rotary electrode drum 12 is polished with a brush having a grit of #800 to #3000 before forming the copper layer 110.

When the surface of the rotary electrode drum 12 is polished with a brush having a grit greater than #3000, the profile of the rotary electrode drum 12 is excessively low, causing very homogeneous electro-deposition. For this reason the maximum profile peak height (Rp) is lower than the arithmetic mean roughness (Ra) and PAR is thus lower than 0.8. That is, although the concentration of silver (Ag) in the electrolyte 11 is controlled to 50 mg/L or less, when the rotary electrode drum 12 is polished with the brush having a grit greater than #3000, PAR can be decreased to a level lower than 0.8.

On the other hand, when the rotary electrode drum 12 is polished with the brush having a grit lower than #800, the surface of the rotary electrode drum 12 becomes rough, the maximum profile peak height (Rp) is excessively greater than the arithmetic mean roughness (Ra) and PAR exceeds 2.5

In addition, when the rotary electrode drum 12 is polished or buffed, water is sprayed in the width direction of the rotary electrode drum 12, so that uniform buffing can be made along the width direction of the rotary electrode drum 12.

During formation of the copper layer 110, the electrolyte 11 can be maintained at a temperature of 40 to 65° C.

In order to reduce the content of impurities in the electrolyte 11, copper wires serving as a raw material for the copper ions are heat-treated, the heat-treated copper wires are cleaned with an acid, and the acid-cleaned copper wires are added to sulfuric acid for an electrolyte.

The electrolyte 11 may have a flow rate of 39 to 46 m³/hour. That is, in order to remove solid impurities present in the electrolyte 11 during electroplating, the electrolyte 11 can be circulated at a flow rate of 39 to 46 m³/hour. During circulation of the electrolyte 11, the electrolyte 11 may be filtered. Such filtering enables silver chloride (AgCl) to be removed so that the content of silver (Ag) in the electrolyte 11 can be maintained at 50 mg/L or less.

When the flow rate of the electrolyte 11 is less than 39 m³/hour, overvoltage is generated due to low flow rate and the copper layer 110 is heterogeneously formed. On the other hand, when the flow rate exceeds 46 m³/hour, a filter is damaged and foreign matter is incorporated into the electrolyte 11.

In addition, in order for the copper foil 200 to have a weight deviation of 3% or less in the width direction, a variation in flow rate of the electrolyte 11 per unit time (sec), which is hereinafter referred to as "flow rate deviation", can be controlled to 5% or less. When the flow rate deviation exceeds 5%, a non-uniform copper layer 110 may be formed due to heterogeneous plating and the weight deviation of the copper foil 200 may thus be increased.

Meanwhile, when the electrolyte 11 is treated with ozone, or the copper layer 110 is formed by electroplating, the clearness of the electrolyte 11 can be maintained or improved by adding peroxide and air to the electrolyte 11.

Then, the copper layer 110 is cleaned in a cleaning bath 20.

In order to remove impurities on the surface of the copper layer 110, the copper layer 110 is cleaned with water in the cleaning bath 20. Alternatively, in order to remove impurities on the surface of the copper layer 110, acid cleaning is conducted and then water cleaning may be conducted to remove the acidic solution used for acid cleaning. The cleaning process may be omitted.

Then, anticorrosive layers 210 and 220 are formed on the copper layer 110.

Referring to FIG. 8, the copper layer 110 is dipped in an anticorrosive liquid 31 contained in the anticorrosion bath 30, to form anticorrosive layers 210 and 220 on the copper layer 110. Here, the anticorrosive liquid 31 includes chromium and chromium (Cr) is present in form of an ion in the anticorrosive liquid 31. The anticorrosive liquid 31 may include 0.5 to 5 g/L of chromium. The anticorrosive layers 210 and 220 thus formed are referred to as "protective layers".

Meanwhile, the anticorrosive layers 210 and 220 may include a silane compound via treatment with silane and a nitrogen compound via treatment with nitrogen.

The copper foil 200 is produced by formation of these anticorrosive layers 210 and 220.

Then, the copper foil 200 is cleaned in a cleaning bath 40. Such a cleaning process may be omitted.

Then, a drying process is preformed and the copper foil 200 is then wound on a winder (WR).

Hereinafter, the present disclosure will be described in more detail with reference to Preparation Examples and Comparative Examples. The Preparation examples are only provided only for better understanding of the present disclosure and should not be construed as limiting the scope of the present disclosure.

Preparation Examples 1-6 and Comparative Examples 1-7

A copper foil was produced using a foil making machine which includes an electrolytic bath 10, a rotary electrode drum 12 disposed in the electrolytic bath 10, and an electrode plate 13 spaced from the rotary electrode drum 12. The electrolyte 11 was a copper sulfate solution, the copper ion concentration of the electrolyte 11 was 75 g/L, a sulfuric acid concentration was 100 g/L, a temperature of the electrolyte 11 was maintained at 55° C., and a current density of 60 ASD was applied to the electrolyte 11.

The rotary electrode drum 12 was polished with brushes having grits (#) set forth in Table 1.

The electrolyte 11 included silver (Ag), polyethylene glycol (PEG) and 1-phenyl-5-mercapto-1H-tetrazole (PMT) in concentrations shown in Table 1. In addition, the electrolyte 11 was circulated at a flow rate of 42 m$^3$/hour and flow rate deviation is shown in Table 1 above.

First, a current density of 60 ASD was applied between the rotary electrode drum 12 and the electrode plate 13 to form a copper layer 110.

Then, the copper layer 110 was dipped in the anticorrosive liquid 31 contained in the anticorrosion bath to form anticorrosive layers 210 and 220 including chromium on the surface of the copper layer 110. At this time, the temperature of the anticorrosive liquid 31 was maintained at 30° C. and the anticorrosive liquid 31 included 2.2 g/L of chromium (Cr). As a result, copper foils according to Preparation Examples 1-6 and Comparative Examples 1-7 were produced.

TABLE 1

| Item | Ag (ppm) | Brush (#) | PMT (ppm) | Flow rate deviation (%) | PEG (ppm) |
|---|---|---|---|---|---|
| Preparation Example 1 | 2 | 2000 | 11 | 0.22 | 11 |
| Preparation Example 2 | 48 | 2000 | 11 | 0.18 | 11 |

TABLE 1-continued

| Item | Ag (ppm) | Brush (#) | PMT (ppm) | Flow rate deviation (%) | PEG (ppm) |
|---|---|---|---|---|---|
| Preparation Example 3 | 24 | 2000 | 3 | 0.05 | 11 |
| Preparation Example 4 | 24 | 2000 | 19 | 0.05 | 11 |
| Preparation Example 5 | 24 | 2000 | 11 | 0.22 | 3 |
| Preparation Example 6 | 24 | 2000 | 11 | 0.18 | 19 |
| Comparative Example 1 | 2 | 4000 | 11 | 0.18 | 11 |
| Comparative Example 2 | 52 | 2000 | 11 | 0.18 | 11 |
| Comparative Example 3 | 24 | 2000 | 1 | 0.18 | 11 |
| Comparative Example 4 | 24 | 2000 | 22 | 0.18 | 11 |
| Comparative Example 5 | 24 | 2000 | 11 | 5.3 | 11 |
| Comparative Example 6 | 24 | 2000 | 11 | 0.18 | 1 |
| Comparative Example 7 | 24 | 2000 | 11 | 0.18 | 22 |

(i) PAR, (ii) tensile strength, (iii) weight deviation and (iv) texture coefficient of (220) plane of [TC(220)] of the copper foils according to Preparation Examples 1-6 and Comparative Examples 1-7 thus produced were measured. Results are shown in Table 2.

(i) Measurement of PAR

Rp and Ra of copper foils produced in Preparation Examples 1-6 and Comparative Examples 1-7 were measured using an SJ-310 model available from Mitutoyo Corporation as a roughness tester. Regarding measurement of Rp and Ra, the measurement length excluding cut off length was 4 mm, and the cut off lengths at the early and late stages were 0.8 mm. In addition, the radius of the stylus tip was set to 2 μm and measurement pressure was set to 0.75 mN. After the setting as described, Rp and Ra were repeatedly measured three times and the means thereof were defined as measurement values of Rp and Ra. Using the measured Rp and Ra, PAR was calculated in accordance with the following Equation 1.

$$PAR = Rp/Ra \qquad \text{[Equation 1]}$$

(ii) Measurement of Tensile Strength

The tensile strengths of copper foils produced in Preparation Examples 1-6 and Comparative Examples 1-7 were measured using a universal testing machine in accordance with the specification of the IPC-TM-650 test method manual. The width of the measurement sample of tensile strength was 12.7 mm, the distance between grips was 50 mm and the measurement speed was 50 mm/min. The tensile strength of the sample was repeatedly measured three times and the mean thereof was evaluated as a measurement result.

(iii) Measurement of Weight Deviation 5 cm×5 cm samples were each obtained from copper foils produced in Preparation Examples 1-6 and Comparative Examples 1-7 at three points arranged in the width direction of respective copper foils, that is, a direction vertical to the winding direction (transverse direction, TD), the weights of respective samples were measured, and the weights per unit area were calculated. "Mean weight" and "standard deviation of weight" at the three points were calculated from the weights per unit area of the three samples, and weight deviation was calculated in accordance with the following Equation 2.

$$\text{Weight deviation} = \frac{\text{Standard deviation of weight}}{\text{Mean weight}} \times 100 \qquad \text{[Equation 2]}$$

(iv) Measurement of Texture Coefficient of (220) Plane [TC(220)]

Copper foils produced in Preparation Examples 1-6 and Comparative Examples 1-7 were subjected to X-ray diffraction (XRD) in the diffraction angle (2θ) range of 30° to 95° [(i) Target: Copper K alpha 1, (ii) 2θ interval: 0.01°, (iii) 2θ scan speed: 3°/min], to obtain a XRD graph having peaks corresponding to n crystal planes, and XRD diffraction intensities [I(hkl)] of respective crystal planes (hkl) were obtained from this graph. In addition, XRD diffraction intensities [I₀(hkl)] of respective n crystal planes of a standard copper powder regulated by joint committee on powder diffraction standards (JCPDS) were obtained. In this case, the crystal planes were (111), (200), (220) and (311) planes, and n was 4.

Subsequently, the arithmetic mean value of "I(hkl)/I₀(hkl)" of n crystal planes was calculated and I(220)/I₀(220) of the (220) plane was divided by the arithmetic mean value to obtain the texture coefficient of (220) plane [TC(220)]. That is, the texture coefficient of (220) plane [TC(220)] is calculated based on the following Equation 3:

$$TC(220) = \frac{\frac{I(220)}{I_0(220)}}{\frac{1}{n}\sum \frac{I(hkl)}{I_0(hkl)}}$$ [Equation 3]

(v) Observation of Occurrence of Bagginess and Tear

Anode Production 100 parts by weight of carbon as a commercially available anode active material was mixed with 2 parts by weight of styrene butadiene rubber (SBR) and 2 parts by weight of carboxymethyl cellulose (CMC), and a slurry for an anode active material was prepared using distilled water as a solvent. Copper foils with a width of 10 cm produced in Preparation Examples 1-6 and Comparative Examples 1-7 were coated to a thickness of 40 μm with the slurry for an anode active material using a doctor blade, dried at 120° C., and pressed at a pressure of 1 ton/cm² to produce an anode for secondary batteries.

Electrolyte Production

LiPF₆ as a solute was dissolved at a concentration of 1M in a non-aqueous organic solvent consisting of ethylene carbonate (EC) and ethyl methyl carbonate (EMC) mixed in a ratio of 1:2 to prepare a basic electrolyte. 99.5% by weight of the basic electrolyte was mixed with 0.5% by weight of succinic anhydride to prepare a non-aqueous electrolyte.

Cathode Production

Lithium manganese oxide ($Li_{1.1}Mn_{1.85}Al_{0.05}O_4$) was mixed with lithium manganese oxide (o-LiMnO₂) having an orthorhombic crystal structure in a weight ratio of 90:10 to produce a cathode active material. The cathode active material, carbon black, and PVDF [poly(vinylidene fluoride)] as a binder were mixed in a weight ratio of 85:10:5, and the resulting mixture was mixed with NMP as an organic solvent to prepare a slurry. Both surfaces of an Al foil with a thickness of 20 μm were coated with the slurry thus prepared and dried to produce a cathode.

Production of Lithium Secondary Battery for Testing

The cathode and the anode were disposed in an aluminium can such that the cathode and the anode were insulated with the aluminium can, and a non-aqueous electrolyte and a separator were disposed to produce a coin-type lithium secondary battery. As the separator, polypropylene (Celgard 2325; thickness 25 μm, average pore size φ28 nm, porosity 40%) was used.

5) Observation of Occurrence of Bagginess and Tear.

In a series of processes of manufacturing a lithium secondary battery, whether or not tear and bagginess of the copper foil occurred was observed. In particular, in the process of producing the copper foil and the anode, whether or not tear and bagginess of the copper foil occurred was observed by the naked eye. The case in which bagginess or tear did not occur was designated as "good". The evaluation and observation results are shown in the following Table 2:

TABLE 2

|  | PAR | Tensile strength (kgf/mm²) | Weight deviation (%) | Texture coefficient of (220) plane | Bagginess | Tear |
| --- | --- | --- | --- | --- | --- | --- |
| Preparation Example 1 | 0.9 | 47.3 | 2.81 | 0.89 | good | good |
| Preparation Example 2 | 12.4 | 47.3 | 2.82 | 0.88 | good | good |
| Preparation Example 3 | 6.7 | 30.1 | 2.79 | 0.86 | good | good |
| Preparation Example 4 | 6.7 | 57.3 | 2.83 | 0.87 | good | good |
| Preparation Example 5 | 6.7 | 47.2 | 2.80 | 0.51 | good | good |
| Preparation Example 6 | 6.7 | 47.1 | 2.82 | 1.26 | good | good |
| Comparative Example 1 | 0.7 | 47.2 | 2.81 | 0.86 | bagginess | good |
| Comparative Example 2 | 12.7 | 47.2 | 2.80 | 0.87 | bagginess | good |
| Comparative Example 3 | 12.2 | 27.7 | 2.82 | 0.86 | bagginess | good |
| Comparative Example 4 | 12.1 | 58.8 | 2.81 | 0.87 | good | tear |
| Comparative Example 5 | 12.0 | 47.2 | 3.20 | 0.87 | bagginess | good |
| Comparative Example 6 | 12.1 | 47.3 | 2.79 | 0.47 | bagginess | good |
| Comparative Example 7 | 12.2 | 47.1 | 2.81 | 1.30 | bagginess | tear |

In the process of manufacturing copper foils and producing lithium secondary batteries according to Comparative Examples 1-7, bagginess or tear of copper foils occurred. On the other hand, in the process of manufacturing copper foils and producing lithium secondary batteries according to Preparation Examples 1-6, bagginess or tear of copper foils did not occur.

Specifically, in the subsequent process of manufacturing a lithium secondary battery using the copper foil, bagginess or tear of the copper foil occurred.

(1) Comparative Example 1 in which the surface of the rotary electrode drum 12 was polished with a brush having a grit greater than #3000 so that PAR was lower than 0.8 (occurrence of bagginess);

(2) Comparative Example 2 in which the content of silver (Ag) in the electrolyte was higher than 50 mg/L so that PAR was higher than 12.5 (occurrence of bagginess);

(3) Comparative Example 3 in which the content of 1-phenyl-5-mercapto-1H-tetrazole (PMT) in the electrolyte was less than 2 mg/L and tensile strength was less than 29 kgf/mm2 (occurrence of bagginess);

(4) Comparative Example 4 in which the content of 1-phenyl-5-mercapto-1H-tetrazole (PMT) in the electrolyte was higher than 20 mg/L and tensile strength was 58 kgf/mm2 (occurrence of tear);

(5) Comparative Example 5 in which the flow rate deviation of electrolyte was higher than 5%/sec and weight deviation was higher than 3% (occurrence of bagginess);

(6) Comparative Example 6 in which the content of polyethylene glycol (PEG) in the electrolyte was less than 2 mg/L and the texture coefficient of (220) plane [TC(220)] was less than 0.49 (occurrence of bagginess);

(7) Comparative Example 7 in which the content of polyethylene glycol (PEG) in the electrolyte was higher than 20 mg/L and the texture coefficient of (220) plane [TC(220)] was higher than 1.28 (occurrence of bagginess and tear).

The copper foils according to Comparative Examples 1-7 were unsuitable for anode current collectors for lithium secondary batteries.

On the other hand, Preparation Examples 1 to 6 produced under the conditions according to the embodiments of the present disclosure could avoid tear and wrinkle of the copper foil in the process of manufacturing the copper foil or in the process of manufacturing a lithium secondary battery using the copper foil. Accordingly, copper foils according to embodiments of the present disclosure had excellent roll-to-roll (RTR) processability and were suitable for anode current collectors for lithium secondary batteries.

The copper foils according to the embodiments of the present disclosure are highly resistant to bagginess or tear. Accordingly, according to an embodiment of the present disclosure, in the process of manufacturing copper foils or in the process of manufacturing secondary batteries using the copper foils, occurrence of bagginess or tear is prevented. The copper foils according to embodiments of the present disclosure have excellent roll-to-roll (RTR) processability.

In addition, according to another embodiment of the present disclosure, occurrence of bagginess or tear is prevented or an electrode for secondary batteries can be produced.

It will be apparent to those skilled in the art that the present disclosure described above is not limited by the above-described embodiments and the accompanying drawings and that various substitutions, modifications, and variations can be made in the present disclosure without departing from the spirit and scope of the disclosures. Consequently, the scope of the present disclosure is defined by the accompanying claims, and it is intended that all variations and modifications derived from the meaning, scope, and equivalent concept of the claims fall within the scope of the present disclosure.

What is claimed is:

1. A copper foil comprising:
   a copper layer; and
   an anticorrosive layer disposed on the copper layer,
   wherein the copper foil haws a peak to arithmetic mean roughness (PAR) of 0.9-12.4, a tensile strength of 30.1-57.3 kgh/mm2, and a weight deviation of 2.79% to 2.83%,
   wherein the copper foil has a surface (220) and the surface (220) has a texture coefficient [TC(220)] of 0.51-1.26,
   wherein the PAR is calculated in accordance with the following Equation:

$PAR=Rp/Ra,$ wherein Rp is a maximum profile peak height and Ra is an arithmetic mean roughness.

2. The copper foil according to claim 1, wherein the anticorrosive layer comprises at least one of chromium (Cr), a silane compound, or a nitrogen compound.

3. The copper foil according to claim 1, wherein the copper foil has a thickness of 4 μm to 30 μm.

4. An electrode for secondary batteries comprising:
   the copper foil according to claim 1; and
   an active material layer disposed on the copper foil.

5. A secondary battery comprising:
   a cathode;
   an anode facing the cathode;
   an electrolyte disposed between the cathode and the anode to provide an environment enabling ions to move; and
   a separator to electrically insulate (isolate) the cathode from the anode, wherein the anode comprises:
   the copper foil according to claim 1; and
   an active material layer disposed on the copper foil.

6. A flexible copper foil laminate film comprising:
   a polymer membrane; and
   the copper foil according to claim 1 disposed on the polymer membrane.

* * * * *